(12) United States Patent
Chen et al.

(10) Patent No.: US 9,627,466 B2
(45) Date of Patent: Apr. 18, 2017

(54) DISPLAY PANEL

(71) Applicant: InnoLux Corporation, Miao-Li County (TW)

(72) Inventors: Yun-Sheng Chen, Miao-Li County (TW); Ming-Chien Sun, Miao-Li County (TW)

(73) Assignee: INNOLUX CORPORATION (TW)

(*) Notice: Subject to any disclaimer, the term of this patent is extended or adjusted under 35 U.S.C. 154(b) by 0 days.

(21) Appl. No.: 14/808,300

(22) Filed: Jul. 24, 2015

(65) Prior Publication Data
US 2016/0293688 A1 Oct. 6, 2016

(30) Foreign Application Priority Data

Apr. 1, 2015 (TW) .............................. 104110662 A

(51) Int. Cl.
*H01L 27/32* (2006.01)
*H01L 51/52* (2006.01)

(52) U.S. Cl.
CPC ........ *H01L 27/3279* (2013.01); *H01L 51/524* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| 5,534,743 A  * | 7/1996 | Jones ..................... G01R 33/10 313/309 |
| 7,473,459 B2 * | 1/2009 | Wu ........................ H05K 3/108 174/257 |
| 9,117,820 B2 * | 8/2015 | Chen ................... H01L 23/5283 |

* cited by examiner

*Primary Examiner* — Quoc Hoang
(74) *Attorney, Agent, or Firm* — Bacon & Thomas, PLLC

(57) ABSTRACT

A display panel is disclosed, which comprises: a first substrate; a first metal line disposed on the first substrate and having a first surface and a first side connecting to the first surface, wherein the first side has a concave shape; and a sealant unit covering the first surface and the first side.

18 Claims, 4 Drawing Sheets

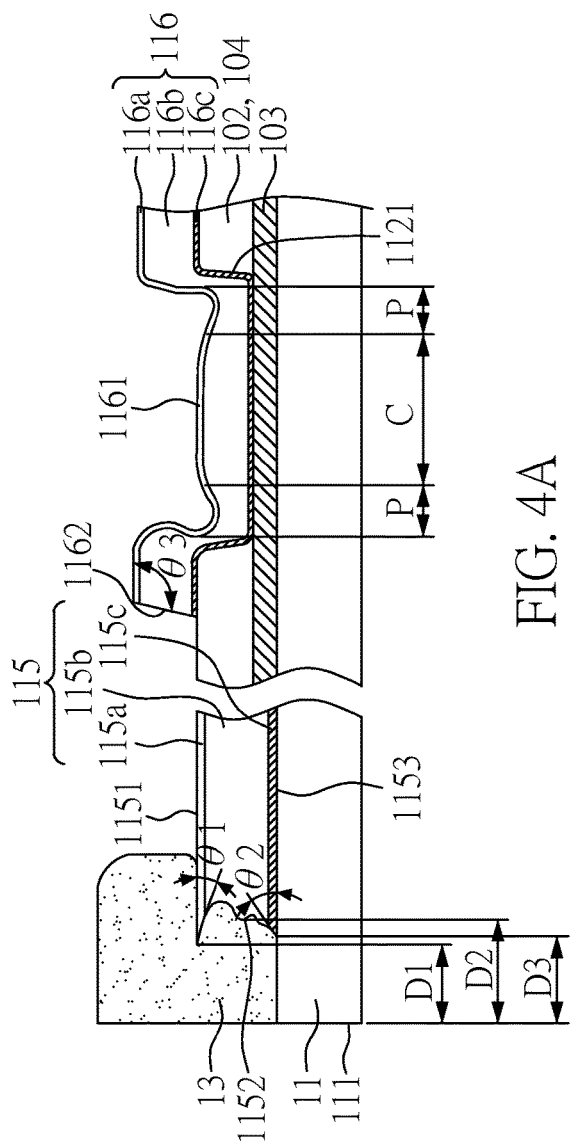
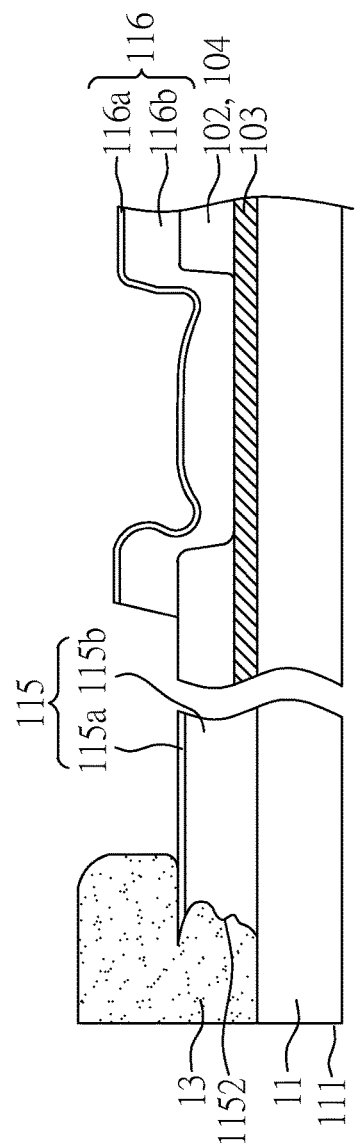
FIG. 4A
FIG. 4B

DISPLAY PANEL

CROSS REFERENCE TO RELATED APPLICATION

This application claims the benefits of the Taiwan Patent Application Serial Number 104110662, filed on Apr. 1, 2015, the subject matter of which is incorporated herein by reference.

BACKGROUND OF THE INVENTION

1. Field of the Invention

The disclosure relates to a display panel and, more particularly, to a display panel having metal layers have specific structures.

2. Description of Related Art

In recent years, all the display devices are developed toward having small volume, thin thickness and light weight as the display techniques progresses. Hence, a conventional cathode ray tube (CRT) display is gradually replaced by flat panel display devices such as a liquid crystal display (LCD) device and an organic light emitting diode (OLED) display device. The flat panel display devices can be applied to various fields. For example, the daily used devices such as cell phones, notebooks, video cameras, cameras, music players, navigation devices, and televisions are equipped with the flat panel display devices.

Although the LCD device and the OLED display device are commercially available and especially the techniques for the LCD device are much mature, every manufacturer is desired to develop display devices with improved display quality to meet customers' requirement as the display devices developed. In particular, the structure of the TFT substrate is one factor related to the display quality.

Even though the LCD device and the OLED display device are well developed and commercialized, it is still necessary to develop a display device with improved display quality to meet the customers' requirement.

SUMMARY OF THE INVENTION

The object of the disclosure is to provide a display panel, wherein a metal line in a non-display region is designed to have a specific structure to increase the adhesion of a sealant to the metal line, and a metal line in a display region is also designed to have a specific structure to decrease the resistance of the metal line in the display region.

One aspect of the disclosure is to provide a display panel, which comprises: a first substrate; a first metal line disposed on the first substrate and having a first surface and a first side connecting to the first surface, wherein the first side has a concave shape; and a sealant covering the first surface and the first side.

In the display panel of this aspect, the first metal line comprises a first metal layer and a second metal layer, the second metal layer locates between the first metal layer and the first substrate, and the sealant covers the first metal layer.

In the display panel of this aspect, the first side of the second metal layer is relatively away from a substrate edge of the first substrate, compared with the first side of the first metal layer.

In the display panel of this aspect, the first metal line further comprises a third metal layer, the second metal layer locates between the first metal layer and the third metal layer, and the sealant further locates between the first metal layer and the third metal layer.

In the display panel of this aspect, the first side of the second metal layer is relatively away from a substrate edge of the first substrate, compared with the first side of the first metal layer and the third metal layer.

In the display panel of this aspect, an acute angle is included between the first surface and the first side.

In the display panel of this aspect, the first metal line further has a second surface opposite to the first surface and connecting to the first side, and an acute angle is included between the second surface and the first side.

In the display panel of this aspect, the sealant is a frit sealant.

In the display panel of this aspect, the first substrate has a display region and a non-display region surrounding the display region, the first metal line is disposed on the non-display region, and the display panel further comprises: an insulating layer disposed on the first substrate and having a contact via locating in the display region; and a second metal line disposed in the contact via and having a third surface, wherein the third surface has a central region and a border region, the border region is relatively near to a side wall of the contact via compared with the central region, and the central region is more protruded than the border region.

Another aspect of the disclosure is to provide another display panel, which comprises: a first substrate having a display region; an insulating layer disposed on the first substrate and having a contact via locating in the display region; and a second metal line disposed in the contact via and having a third surface, wherein the third surface has a central region and a border region, the border region is relatively near to a side wall of the contact via compared with the central region, and the central region is more protruded than the border region.

In the display panel of this aspect, the second metal line comprises a fourth metal layer and a fifth metal layer, the fifth metal layer locates between the first substrate and the fourth metal layer, and the fourth metal layer has a third surface and a second side, in which the third surface connects to the second side and an obtuse angle is included between the third surface and the second side.

The display panel of this aspect may further comprise an organic display medium disposed on the second metal line.

In the display panel of this aspect, a thickness of the central region of the second metal line is larger than that of the border region thereof.

In the display panel of this aspect, the first substrate further comprises a non-display region surrounding the display region, and the display panel further comprises: a first metal line disposed in the non-display region and having a first surface and a first side connecting to the first surface, wherein the first side has a concave shape; and a sealant covering the first surface and the first side.

In the display panel of this aspect, the sealant is a frit sealant.

In the display panel of this aspect, the first metal line comprises a first metal layer and a second metal layer, the second metal layer locates between the first metal layer and the first substrate, and the sealant convers the first metal layer.

In the display panel of this aspect, the first metal line further comprises a third metal layer, the second metal layer locates between the first metal layer and the third metal layer, and the sealant further locates between the first metal layer and the third metal layer.

In the display panel of this aspect, the first side of the second metal layer is relatively away from a substrate edge of the first substrate, compared with the first side of the first metal layer and the third metal layer.

In the display panel of this aspect, an acute angle is included between the first surface and the first side.

In the display panel of this aspect, the first metal line further has a second surface opposite to the first surface and connecting to the first side, and an acute angle is included between the second surface and the first side.

In the display panels provided by the aforementioned aspects of the disclosure, the metal line in the non-display region is designed to have a specific structure, and especially the side of the metal line in the non-display region is designed to have a concave shape. Hence, the adhesion of the sealant to the metal line can be increased during the process for coating the sealant, further preventing the peeling of the sealant. Meanwhile, the metal line in the display region is also designed to have a specific structure, and especially the central region of the metal line in the contact via is designed to be more protruded than the border region. Hence, a cross-sectional area of the metal line can be increased, further decreasing the resistance of the metal line during the operation of the display panel. Herein, the shape of the metal line in the display region does not have the concave shape as that in the non-display region. Charges may be accumulated at the sharp corner corresponding to the acute angle included between the surface and the side of the metal line in the non-display region and the accumulated charges may cause the point discharge occurred. However, an obtuse angle is included between the surface and the side of the metal line in the display region, and the metal line therein has a relatively smooth inclined shape. Hence, there is no sharp corner formed in the display region, and thus the point discharge and the problem of the decreased anti-static capability in the display region can be prevented.

Other objects, advantages, and novel features of the invention will become more apparent from the following detailed description when taken in conjunction with the accompanying drawings.

BRIEF DESCRIPTION OF THE DRAWINGS

FIG. 4A is a cross-sectional view showing parts of a display region and a non-display region of an OLED display panel according to one preferred embodiment of the disclosure; and FIG. 4B is a cross-sectional view showing parts of a display region and a non-display region of an OLED display panel according to another preferred embodiment of the disclosure.

DETAILED DESCRIPTION OF THE PREFERRED EMBODIMENT

The disclosure has been described in an illustrative manner, and it is to be understood that the terminology used is intended to be in the nature of description rather than of limitation. Many modifications and variations of the disclosure are possible in light of the above teachings. Therefore, it is to be understood that within the scope of the appended claims, the invention may be practiced otherwise than as specifically described.

Figure 1:
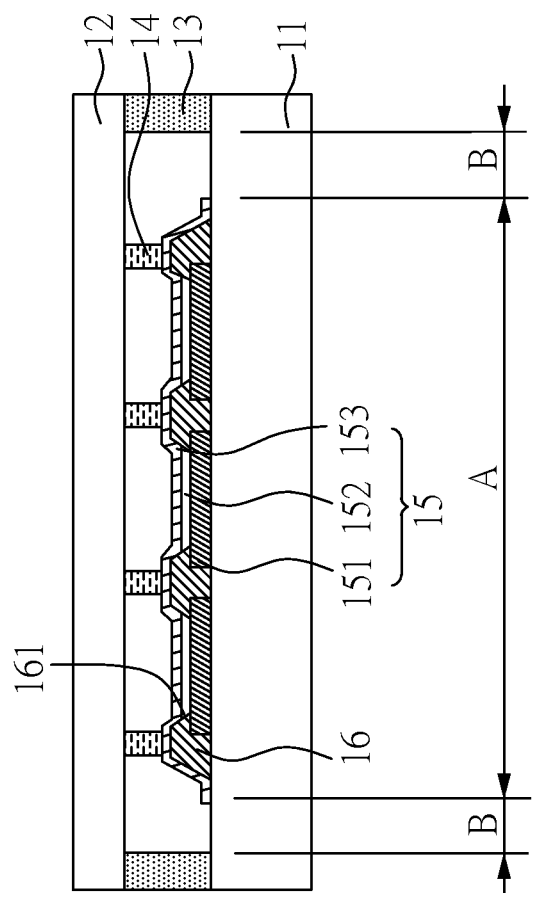
FIG. 1 is a cross-sectional view of an OLED display panel according to one preferred embodiment of the disclosure.

FIG. 1 is a cross-sectional view of an OLED display panel according to one preferred embodiment of the disclosure. During the process for manufacturing the OLED display panel, a first substrate 11 and a second substrate 12 are firstly provided. Organic light emitting diode (OLED) units 15 and pixel defining layers 16 are disposed on the first substrate 11, wherein each pixel defining layer 16 is disposed between two adjacent OLED units 15. In addition, plural spacers 14 are disposed on the second substrate 12, and a sealant 13 (a frit sealant in the present embodiment) is formed on a periphery of the second substrate 12 in advance, which is formed through a dispensing process and a sintering process to be fixed on the second substrate 12. Then, the first substrate 11 is assembled with the second substrate 12, wherein the spacers 14 on the second substrate 12 correspond to regions outside the pixel opening 161 of the pixel defining layer 16. After the sealant 13 is adhered onto the first substrate 11 through a laser process, an OLED display panel of the present embodiment is obtained.

In the present embodiment, both the first substrate 11 and the second substrate 12 are glass substrates. In addition, the OLED display device of the present embodiment comprises a display region A and a non-display region B, wherein the non-display region B is a region with circuits formed thereon, and the display region A is a region with the aforementioned OLED units 15 and TFT units (not shown in the figure) formed thereon. Furthermore, in the present embodiment, the OLED units 15 can respectively emit red, green and blue light; but the disclosure is not limited thereto. For example, the OLED units 15 can be white OLED units, and a color filter unit (not shown in the figure) is further disposed on a side of the first substrate 11 or the second substrate 12.

In addition, in the OLED display panel of the present embodiment, the OLED units 15 comprise a first electrode 151, an organic display medium 152 and a second electrode 153 sequentially laminated on the first substrate 11. Herein, the first electrode 151 electrically connects to the TFT units (not shown in the figure) on the first substrate 11. The pixel defining layer 16 is disposed between the first electrode 151 and the organic display medium 152, and a light emitting region is defined by the pixel opening 161 of the pixel defining layer 16.

Furthermore, in the OLED display panel of the present embodiment, the first electrode 151 can be made of any material for reflective electrodes or transparent electrodes generally used in the art, and the second electrode 153 can be made of any material for transparent or semi-transparent electrodes generally used in the art. The materials for the reflective electrodes may be Ag, Ge, Al, Cu, Mo, Ti, Sn, AlNd, ACX or APC, the materials for the transparent electrodes may be transparent conductive oxides (TCO) such as ITO and IZO, and the semi-transparent electrodes may be metal thin film electrodes such as Mg/Ag alloy thin film electrodes, Au thin film electrodes, Pt thin film electrodes and Al thin film electrodes. In addition, the second electrode 153 used herein can be a composite electrode of a transparent electrode and a semi-transparent electrode (for example, a composite electrode of a TCO electrode and a Pt thin film electrode), if it is needed. Herein, only the OLED unit comprising the first electrode 151, the organic display medium 152 and the second electrode 153 is present, but the disclosure is not limited thereto. Other OLED units generally used in the art can also be applied to the OLED display panel of the disclosure, for example, the OLED unit comprising an electron transporting layer, an electron injection layer, a hole transporting layer, a hole injection layer, and/or other layers capable of facilitating the combination of holes and electrons.

Figure 2:
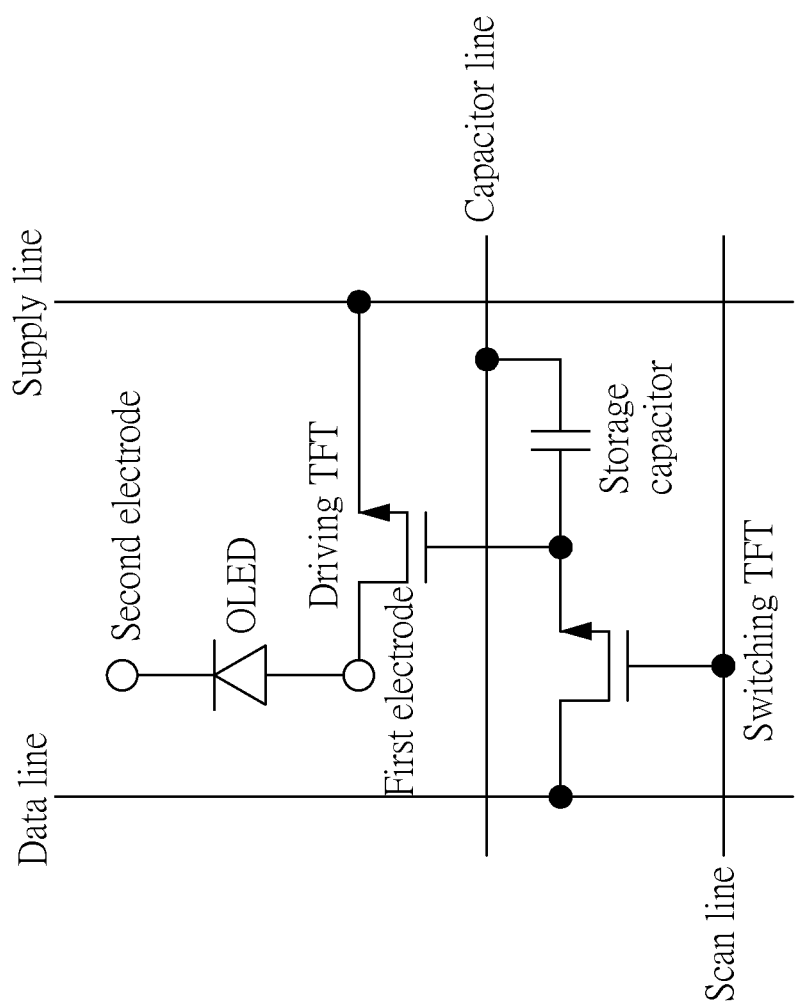
FIG. 2 is a schematic view showing a layout of an OLED display panel according to one preferred embodiment of the disclosure.

FIG. 2 is a schematic view showing a layout of an OLED display device of the present embodiment. As shown in FIG. 2, in the OLED display panel of the present embodiment, each pixel unit respectively comprises: a scan line, a data line, a capacitor line, a supply line, a switching TFT unit (shown as switching TFT in FIG. 2), a driving TFT unit (shown as driving TFT in FIG. 2), a storage capacitor, and an OLED unit (shown as OLED in FIG. 2) connecting to a first electrode and a second electrode.

Figure 3:
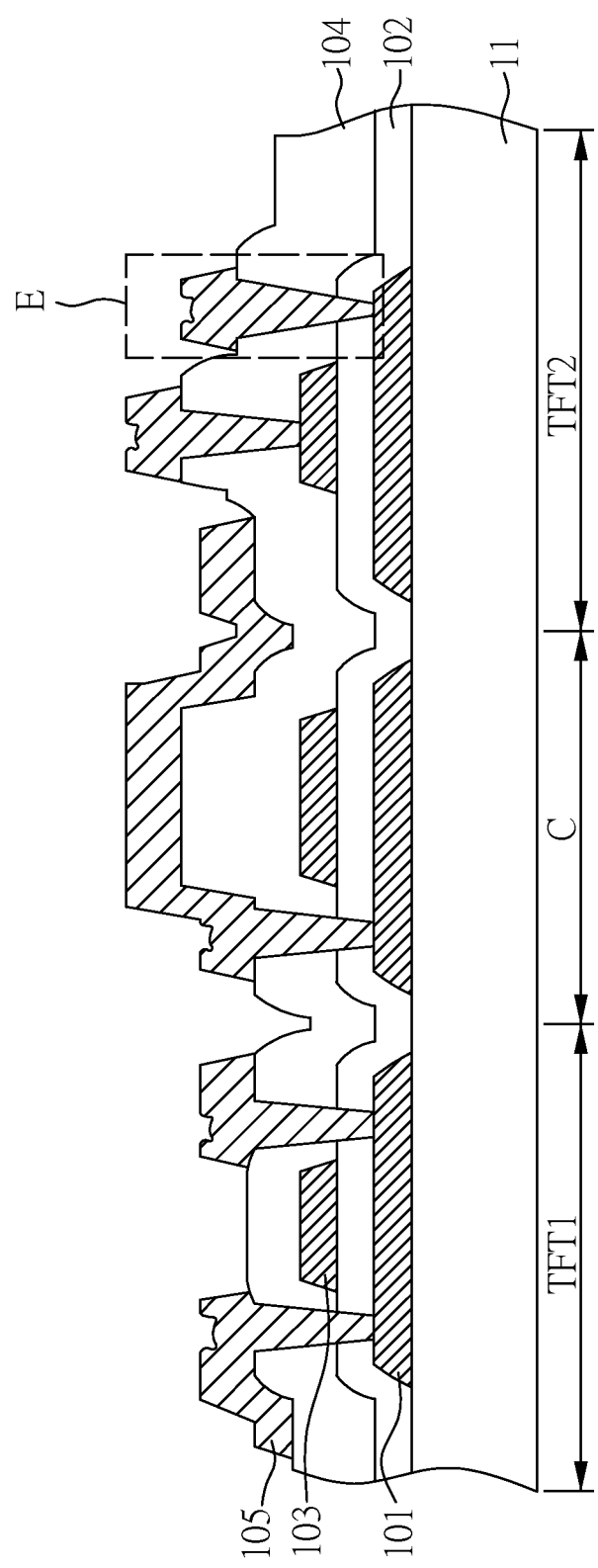
FIG. 3 is a cross-sectional view of a thin film transistor (TFT) substrate of an OLED display panel according to one preferred embodiment of the disclosure.

FIG. 3 is a cross-sectional view showing a TFT substrate of the OLED display panel of the present embodiment. As shown in FIGS. 1 and 3, the TFT substrate of the present embodiment comprises: a first substrate; and TFT unis disposed thereon. As shown in FIG. 3, in the display region A shown in FIG. 1, a first substrate 11 is firstly provided, and an active layer 101 is further formed thereon. In the present embodiment, the active layer 101 is made of polysilicon formed by annealing amorphous silicon. Then, a first insulating layer 102, a bottom metal layer 103 and a second insulating layer 104 are sequentially formed on the first substrate 11. Herein, the bottom metal layer 103 located in the TFT regions TFT1, TFT2 is served as gate electrodes. The first insulating layer 102 is served as a gate insulating layer, which is made of any insulating material generally used in the art, such as silicon oxides and silicon nitrides. In addition, the second insulating layer 104 can also be made by the aforementioned insulating material generally used in the art. Next, an upper metal layer 105 is formed on the second insulating layer 104. Herein, the upper metal layer 105 located in the TFT regions TFT1, TFT2 further penetrate through the first insulating layer 102 and the second insulating layer 104, to be used as a source electrode and a drain electrode electrically connecting to the active layer 101. After the aforementioned process, the TFT substrate of the present embodiment is obtained.

In the present embodiment, the TFT substrate comprises two TFT regions TFT1, TFT2, wherein the TFT region TFT1 corresponds to the switching TFT shown in FIG. 2, and the TFT region TFT2 corresponds to the driving TFT shown in FIG. 2. In addition, in the present embodiment, except for the TFT regions TFT1, TFT2, a capacitor region C is also formed, which corresponds to the storage capacitor shown in FIG. 2. In the present embodiment, the TFT unit on the TFT substrate is a low temperature poly-silicon (LTPS) TFT unit. However, in other embodiment of the disclosure, the structure of the TFT unit is not limited to that shown in FIG. 3. In addition, in other embodiment of the disclosure, the TFT unit does not only comprise the layers shown in FIG. 3, and may also comprise other layers such as buffer layers and other insulating layers, to increase the adhesion between layers and the electricity of the TFT unit.

In the present embodiment, the upper metal layer may be formed by any process known in the art, such as deposition and electroplating. Herein, in order to increase the adhesion of the upper metal layer in the non-display region and decrease the resistance of the upper metal layer in the display region, a patterning process by using a mask (for example, an etching by using a mask) may be performed on the upper metal layer to make the upper metal layer have a predetermined pattern. Alternatively, a printing process may be performed to directly form an upper metal layer having a predetermined pattern.

Hereinafter, the structure of the upper metal layer in the display region and the non-display region of the OLED display panel of the present embodiment is illustrated in detail.

As shown in FIG. 4A, which is a cross-sectional view showing parts of the display region and the non-display region of the OLED display panel of the present embodiment, wherein the left side of FIG. 4A shows a cross-section of partial non-display region B in FIG. 1, and the right side thereof shows a cross-section of partial display region A in FIG. 1 and especially the region E in FIG. 3.

As shown in FIG. 4A, in the non-display region of the OLED display panel of the present embodiment, the display panel comprises: a first substrate 11 with a substrate edge 111; a first metal line 115 disposed on the first substrate 11, wherein the first metal line 115 is one metal line comprised in the aforementioned formed upper metal layer, the first metal line 115 has a first surface 1151, a second surface 1153 opposite to the first surface 1151, and a first side 1152 locating between the first surface 1151 and the second surface 1153 and connecting to the first surface 1151 and the second surface 1153; and a sealant 13 covering the first surface 1151 and the first side 1152. More specifically, the sealant 13 covers partial first surface 1151 and the whole first side 1152.

In the present embodiment, the first side 1152 of the first metal line 115 has a concave shape. More specifically, the first metal line 115 comprises a first metal layer 115a, a second metal layer 115b and a third metal layer 115c, the second metal layer 115b locates between the first metal layer 115a and the first substrate 11 and also between the first metal layer 115a and the third metal layer 115c. In this case, the sealant 13 covers the first metal layer 115a, and further locates between the first metal layer 115a and the third metal layer 115c. In other words, the first side 1152 of the second metal layer 115b is relatively away from the substrate edge 111 of the first substrate 11, compared with the first side 1152 of the first metal layer 115a and the third metal layer 115c. That is, a distance D2 between any end of the first side 1152 of the second metal layer 115b and an extension line of the substrate edge 111 is larger than minimum distances D1, D3 between any ends of the first side 1152 of the first metal layer 115a and the third metal layer 115c and the extension line of the substrate edge 111. In addition, an acute angle $\theta 1$ is included between the first surface 1151 and the first side 1152, and another acute angle $\theta 2$ is included between the second surface 1153 and the first side 1152. In the present embodiment, the acute angles $\theta 1$, $\theta 2$ are not particularly limited, as long as in a range between 0 degree and 90 degree. Furthermore, the first side 1152 of the first metal line 115 has not only the concave shape but also a rough surface.

In the OLED display panel of the present embodiment, the first side 1152 of the first metal line 115 is designed to have a concave shape, so the adhesion between the first metal line 115 and the sealant 13 can be increased to prevent the peeling of the sealant 13 during the process for coating the sealant 13; therefore, the yield rate of the display panel can be improved. Furthermore, the first side 1152 of the first metal line 115 is also designed to have a rough surface, to further improve the adhesion between the first metal line 115 and the sealant 13.

However, if the metal line in the display region is designed to have the concave shape as that in the non-display region, charges may be easily accumulated at the sharp corner near to the surface of the metal lines and the anti-static capability of the display region will be decreased. Hence, in the OLED display panel of the disclosure, the shapes of the metal lines in the display region and the non-display region are different.

As shown in FIGS. 3 and 4A, in the display region of the OLED display panel of the present embodiment, the display panel comprises: a first substrate 11; an insulating layer (comprising the first insulating layer 102 and the second insulating layer 104) disposed on the first substrate 11 and having a contact via 1121; and a second metal line 116 disposed in the contact via 1121, wherein the second metal line 116 is one metal line comprised in the aforementioned formed upper metal layer, the second metal line 116 has a third surface 1161 and a second side 1162 connecting to the third surface 1161, the third surface 1161 has a central region C and a border region P, the border region P is relatively near to a side wall of the contact via 1121 compared with the central region C, and the central region C is more protruded than the border region P. More specifically, a thickness of the central region C of the second metal line 116 is larger than that of the border region P thereof. When the central region C of the second metal line 116 is designed to be more protruded than the border region P thereof, a sectional area of the second metal line 116 can be increased; thus, the resistance of the second metal line 116 can be decreased to improve the electricity of the TFT units (not shown in the figure).

In addition, in the display region of the OLED display panel of the present embodiment, the second metal line 116 comprises a fourth metal layer 116a, a fifth metal layer 116b, and a sixth metal layer 116c, wherein the fifth metal layer 116b locates between the first substrate 11 and the fourth metal layer 116a and between the fourth metal layer 116a and the sixth metal layer 116c. Herein, the fourth metal layer 116a has a third surface 1161 and a second side 1162, in which the third surface 1161 connects to the second side 1162 and an obtuse angle θ3 is included between the third surface 1161 and the second side 1162. In the present embodiment, the degree of the obtuse angle θ3 is not particularly limited, as long as in a range between 90 degree and 180 degree.

Please compare the display region shown in the left side of FIG. 4A with the non-display region shown in the right side thereof. It can be found that the first side 1152 of the first metal line 115 has a concave shape and a rough surface, but the second side 1162 of the second metal line 116 has a relatively smooth inclined shape. More particularly, the acute angles θ1, θ2 are respectively included between the first side 1152 and the first surface 1151 as well as the second surface 1153 of the first metal line 115 in the non-display region, but an obtuse angle θ3 is included between the third surface 1161 and the second side 1162 of the second metal line 116 in the display region. Hence, in the display panel of the present embodiment, no sharp corner (as that present in the first metal line 115 in the non-display region) is present in the second metal line 116 in the display region, so the problem of charge accumulation can be prevented and the anti-static capability of the units in the display region can further be improved.

FIG. 4B is a cross-sectional view showing parts of the display region and the non-display region of the OLED display panel of another embodiment in the disclosure. Herein, the structure and the manufacturing process of the OLED display panel of the present embodiment are the same as those illustrate in the aforementioned embodiment, except that the first metal line 115 in the present embodiment does not comprise the third metal layer 115c, and the second metal line 116 does not comprise the sixth metal layer 116c. Hence, in the present case, the first metal line 115 only comprise the first metal layer 115a and the second metal layer 115b, wherein the second metal layer 115b locates between the first metal layer 115a and the first substrate 11, and the sealant 13 covers the first metal layer 115a. Meanwhile, the first side 1152 of the second metal layer 115b is relatively away from the substrate edge 111 of the first substrate 11, compared with the first side 1152 of the first metal layer 115a.

In the present embodiment, as shown in FIGS. 3, 4A and 4B, the materials for the bottom metal layer 103 and the upper metal layer 105 for forming the first metal line 115 and the second metal line 116 are not particularly limited, and can be any material for metal electrodes generally used in the art. In the aforementioned embodiment of the disclosure, the material for the bottom metal layer 103 is Mo, that for the first metal layer 115a is Ti, that for the second metal layer 115b is Al, that for the third metal layer 115c is Ti, that for the fourth metal layer 116a is Ti, that for the fifth metal layer 116b is Al, and that for the sixth metal layer 116c is Ti.

In the OLED display panels provided by the aforementioned embodiments of the disclosure, the first metal line and the second metal line can be the same conductive line or different conductive lines, and not particularly limited, as long as the first metal line and the second metal line have the aforementioned features.

In the present embodiments, OLED display panels are provided. However, in other embodiment of the disclosure, the aforementioned TFT substrate can also be applied on a LCD panel. When the aforementioned TFT substrate is applied on a LCD panel, the obtained LCD panel is further assembled with a backlight module to obtain a LCD device.

The display panel provided by the aforementioned embodiment can be co-used with any touch panel known in the art, to obtain a touch display device.

In addition, the display device provided by the disclosure can be applied to any electronic device for displaying images, such as a mobile phone, a notebook, a camera, a video camera, a music player, a navigation system, or a television.

Although the disclosure has been explained in relation to its preferred embodiment, it is to be understood that many other possible modifications and variations can be made without departing from the spirit and scope of the invention as hereinafter claimed.

What is claimed is:

1. A display panel, comprising:
    a first substrate;
    a first metal line disposed above the first substrate and having a first surface and a first side connecting to the first surface, wherein the first side has a concave shape; and
    a sealant covering the first surface and the first side,
    wherein the first metal line comprises a first metal layer, a second metal layer and a third metal layer, the second metal layer locates between the first metal layer and the third metal layer, and the sealant covers the first metal layer and locates between the first metal layer and the third metal layer.

2. The display panel as claimed in claim 1, wherein the second metal layer locates between the first metal layer and the first substrate.

3. The display panel as claimed in claim 2, wherein the first side of the second metal layer is relatively away from a substrate edge of the first substrate, compared with the first side of the first metal layer.

4. The display panel as claimed in claim 1, wherein the first side of the second metal layer is relatively away from a substrate edge of the first substrate, compared with the first side of the first metal layer and the third metal layer.

5. The display panel as claimed in claim 1, wherein an acute angle is included between the first surface and the first side.

6. The display panel as claimed in claim 1, wherein the first metal line further has a second surface opposite to the first surface and connecting to the first side, and an acute angle is included between the second surface and the first side.

7. The display panel as claimed in claim 1, wherein the sealant is a frit sealant.

8. The display panel as claimed in claim 1, wherein the first substrate has a display region and a non-display region surrounding the display region, the first metal line is disposed above the non-display region, and the display panel further comprises:
   an insulating layer disposed above the first substrate and having a contact via locating in the display region; and
   a second metal line disposed in the contact via and having a third surface, wherein the third surface has a central region and a border region, the border region is relatively near to a side wall of the contact via compared with the central region, and the central region is more protruded than the border region.

9. A display panel, comprising;
   a first substrate having a display region;
   an insulating layer disposed above the first substrate and having a contact via locating in the display region;
   a second metal line disposed in the contact via and having a third surface; and
   an organic display medium disposed above the second metal line,
   wherein the third surface has a central region and a border region, the border region is relatively near to a side wall of the contact via compared with the central region, and the central region is more protruded than the border region.

10. The display panel as claimed in claim 9, wherein the second metal line comprises a fourth metal layer and a fifth metal layer, the fifth metal layer locates between the first substrate and the fourth metal layer, and the fourth metal layer has a third surface and a second side, in which the third surface connects to the second side and an obtuse angle is included between the third surface and the second side.

11. The display panel as claimed in claim 9, wherein a thickness of the central region of the second metal line is larger than that of the border region thereof.

12. The display panel as claimed in claim 9, wherein the first substrate further comprises a non-display region surrounding the display region, and the display panel further comprises:
   a first metal line disposed in the non-display region and having a first surface and a first side connecting to the first surface, wherein the first side has a concave shape; and
   a sealant covering the first surface and the first side.

13. The display panel as claimed in claim 12, wherein the sealant is a frit sealant.

14. The display panel as claimed in claim 13, wherein the first metal line comprises a first metal layer and a second metal layer, the second metal layer locates between the first metal layer and the first substrate, and the sealant convers the first metal layer.

15. The display panel as claimed in claim 14, wherein the first metal line further comprises a third metal layer, the second metal layer locates between the first metal layer and the third metal layer, and the sealant further locates between the first metal layer and the third metal layer.

16. The display panel as claimed in claim 15, wherein the first side of the second metal layer is relatively away from a substrate edge of the first substrate, compared with the first side of the first metal layer and the third metal layer.

17. The display panel as claimed in claim 12, wherein an acute angle is included between the first surface and the first side.

18. The display panel as claimed in claim 12, wherein the first metal line further has a second surface opposite to the first surface and connecting to the first side, and an acute angle is included between the second surface and the first side.

* * * * *